United States Patent
Hong

(10) Patent No.: US 7,772,627 B2
(45) Date of Patent: *Aug. 10, 2010

(54) IMAGE SENSOR WITH FLOATING DIFFUSION GATE CAPACITOR

(75) Inventor: Sungkwon C. Hong, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/362,944

(22) Filed: Jan. 30, 2009

(65) Prior Publication Data

US 2009/0134313 A1    May 28, 2009

Related U.S. Application Data

(63) Continuation of application No. 11/399,311, filed on Apr. 7, 2006, now Pat. No. 7,498,623, which is a continuation of application No. 10/618,627, filed on Jul. 15, 2003, now Pat. No. 7,078,746.

(51) Int. Cl.
*H01L 31/062* (2006.01)
(52) U.S. Cl. .............................. 257/292; 257/E27.132
(58) Field of Classification Search ................. 257/292, 257/532, E27.132
See application file for complete search history.

(56) References Cited

U.S. PATENT DOCUMENTS

| | | | |
|---|---|---|---|
| 4,811,371 A | 3/1989 | Tower | |
| 5,422,669 A | 6/1995 | Mori | |
| 6,204,524 B1 | 3/2001 | Rhodes | |
| 6,246,436 B1 | 6/2001 | Lin et al. | |
| 6,310,369 B1 | 10/2001 | Narabu et al. | |
| 6,429,470 B1 | 8/2002 | Rhodes | |
| 6,512,544 B1 | 1/2003 | Merrill et al. | |
| 7,075,049 B2 | 7/2006 | Rhodes et al. | |
| 7,078,746 B2 | 7/2006 | Hong | |
| 7,498,623 B2* | 3/2009 | Hong | 257/292 |
| 2004/0251394 A1 | 12/2004 | Rhodes et al. | |
| 2005/0012168 A1 | 1/2005 | Hong | |
| 2005/0052554 A1 | 3/2005 | Sakurai et al. | |

FOREIGN PATENT DOCUMENTS

| | | |
|---|---|---|
| EP | 1 231 641 A1 | 8/2002 |
| JP | 05-251480 A | 9/1993 |
| JP | 2000-165754 | 6/2000 |

OTHER PUBLICATIONS

International Search Report dated Oct. 14, 2004.

* cited by examiner

*Primary Examiner*—Mark Prenty
(74) *Attorney, Agent, or Firm*—Dickstein Shapiro LLP

(57) ABSTRACT

Pixel cells are provided which employ a gate capacitor associated with the floating diffusion node to selectively increase the storage capacity of the floating diffusion node. The gate capacitor can be formed at the same time as the same process steps used to form other gates of the pixel cells. The inherent capacity of the storage node alone may be sufficient under low light conditions. Higher light conditions may result in selective activation of the gate capacitor, thus increasing the capacity of the storage node with the additional capacity provided by the gate capacitor. The invention produces high dynamic range and high output signal without charge sharing or lag output signal. Methods of forming such pixel cells can be applied in CMOS and CCD imaging devices, image pixel arrays in CMOS and CCD imaging devices, and CMOS and CCD imager systems.

13 Claims, 12 Drawing Sheets

US 7,772,627 B2

IMAGE SENSOR WITH FLOATING DIFFUSION GATE CAPACITOR

CROSS REFERENCE TO RELATED APPLICATIONS

The present application is a continuation of Ser. No. 11/399,311, filed Apr. 7, 2006, now U.S. Pat. No. 7,498,623, which is a continuation of Ser. No. 10/618,627 which was filed on Jul. 15, 2003, now U.S. Pat. No. 7,078,746, issued Jul. 18, 2006, the entire disclosures of which are incorporated herein by reference.

FIELD OF THE INVENTION

The present invention relates to a pixel circuit of an image sensor having an associated storage capacitor.

BACKGROUND OF THE INVENTION

An image sensor circuit includes a focal plane array of pixel cells, each one of the cells including either a photogate, photoconductor, or photodiode overlying a charge accumulation region within a substrate for accumulating photo-generated charge. In a conventional four transistor CMOS imager, the active elements of a pixel cell perform: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. In a three transistor pixel cell the active elements of a pixel cell perform: (1) photon to charge conversion; (2) accumulation of image charge by the photoconversion device; (3) resetting the photoconversion device to a known state before charge accumulation; (4) selection of a pixel for readout; and (5) output and amplification of a signal representing the pixel charge.

Referring to FIGS. 1A and 1B, a semiconductor wafer fragment of a conventional CMOS image sensor four-transistor (4T) pixel 10 is shown. A view of a section of the conventional CMOS image sensor taken along line 1B-1B of FIG. 1A is shown in FIG. 1B. The pixel 10 generally comprises a transfer gate 50 for transferring photoelectric charges generated in a pinned photodiode 21 to a floating diffusion region 25 acting as a sensing node. The floating diffusion region 25 is connected to a reset transistor having a gate 40 for resetting the sensing node. A source follower transistor having a gate 60 is connected to a row select transistor having a gate 80. Impurity doped source/drain regions 22 are provided about gates 40, 60, 80. Spacers 92 may be formed along the sides of gates 40, 50, 60 and 80.

As shown in FIG. 1B, photodiode 21 is illustratively a shallow pinned photodiode just beneath the surface 15 of substrate 20. The pinned photodiode 21 typically has a photosensitive p-n-p junction region comprising a p-type surface region 24 and an n-type photodiode region 26 within a p-type substrate 20. Trench isolation regions 28 are formed in the substrate 20 to isolate the pixels within a pixel array. A translucent or transparent insulating layer 30 may be formed over the pixel 10. Contacts 32 (FIG. 1A) may be formed in the insulating layer 30 to provide an electrical connection to the source/drain regions 22, floating diffusion region 25, and other wiring to connect gate lines and other connections in the pixel 10.

FIG. 2 depicts a conventional four transistor (4T) CMOS image sensor pixel, which optionally employs a polysilicon capacitor ($C_{poly}$) 100. Photons 112 are absorbed just beneath the surface 15 of substrate 20 in the region of the pinned photodiode 21. Electron-hole pairs are generated, and the electrons are collected in n-region 26 of the pinned photodiode 21 as long as the transfer gate 50 is "off". The pinned photodiode 21 is characterized by a pin potential ($V_{pin}$), which is a highest applied voltage of the p-n-p photodiode. Once the transfer gate 50 is activated (i.e., turned "on"), the photon-generated electrons can flow to the floating diffusion region 25 from n-region 26. After a certain period of time, the transfer gate 50 will be switched back to the "off" state.

FIG. 3 is a potential diagram of the conventional 4T CMOS sensor pixel during a light integration period. The full well charge capacity of the pixel is a maximum number of electrons which can be generated and stored in the photodiode 21. Photons 112 transmitted to the photodiode 21 generate electrons in regions 21. The charge capacity of the photodiode 21 to hold the electrons is illustrated by shaded area 120. This area 120 is determined approximately by the pinned potential ($V_{PIN}$) of photodiode 21 and the photodiode capacity ($C_{PD}$). When the number of generated electrons reaches the maximum charge capacity, the photodiode 21 is saturated and is unable to further respond to the incident photons 112. The excess charge causes a blooming effect to neighboring pixels as the excess charge moves through substrate 20 into the neighboring pixels. When the electrons from photodiode 21 are transferred to the floating diffusion node 25 by gate 50 turning on, the "capacity" to store electrons is determined by the capacity of the floating diffusion node 25 and that of capacitor 100.

FIG. 4 depicts an exemplary charge transfer operation in the conventional four transistor (4T) CMOS sensor pixel cell. When the fill-well capacity of the photodiode 21 is larger than the charge holding capacity of the floating diffusion node 25, there is charge sharing between the photodiode 21 and floating diffusion node 25. In this case, when the transfer gate 50 goes back to the "off" state, photodiode 21 will retain signal charge which mixes with generated signal charge of the next frame causing image lag. This saturation of the floating diffusion node 25 limits dynamic range of the conventional four transistor (4T) pixel.

As pixels are scaled down in size a lower floating diffusion node capacity is seen which further lowers the dynamic range of a pixel. It is therefore desirable to improve the dynamic range to provide a good output response for low light and also high light signal conditions even when pixels are scaled down. To this end storage capacitors, e.g., capacitor 100, FIG. 2, have been proposed for use with the floating diffusion node to increase charge storage capacity. See, for example, U.S. Pat. Nos. 6,429,470 and 6,204,524 to Rhodes. However, such capacitors while increasing the capacitance of the floating diffusion node, also are relatively inflexible as they are always in circuit with the floating diffusion node. Moreover, additional processing steps are required to form a capacitor coupled to the floating diffusion node.

SUMMARY OF THE INVENTION

Embodiments of the invention provide four transistor (4T) image sensor pixel cells having a gate capacitor associated with the floating diffusion node which can be selectively operated to increase the storage capacity of the floating diffusion node. The gate capacitor can be economically formed at the same time, and using the same process steps, as other gates of transistors of the pixel cells.

In some circumstances it may be desirable to only rely on the inherent capacity of the storage node, while in other circumstances it may be desirable to rely on the inherent capacity of the storage node plus the additional capacity provided by an additional capacitor. The gate capacitor can be selectively operated to add capacitance to the storage node as needed or desired.

These and other features and advantages of the invention will be more apparent from the following detailed description that is provided in connection with the accompanying drawings and illustrated exemplary embodiments of the invention.

BRIEF DESCRIPTION OF THE DRAWINGS

The foregoing and other advantages and features of the invention will become more apparent from the detailed description of exemplary embodiments provided below with reference to the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description, and may include any semiconductor structure in or at a surface of which circuitry can be formed. The structure can include any of silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form layers, regions or junctions in or over the base semiconductor or foundation.

The term "pixel" refers to a picture element unit cell containing a photosensor and devices, such as transistors for converting electromagnetic radiation to an electrical signal. For purposes of illustration, a representative pixel is illustrated in the figures and description herein, and typically fabrication of all pixels in an imager will proceed simultaneously in a similar fashion. Like-numbered elements described above refer to the same elements depicted in FIGS. 5-8.

It should be understood that the invention is applicable to pixel cells in any arrangement and orientation for integration with other components of a semiconductor device. The invention may optionally include photogates, photoconductors, or other image to charge converting devices, in lieu of photodiodes, for initial accumulation of photo-generated charge.

As used herein in the description of the invention, the "n" and "p" designations, as in "n-type" and "p-type", are used in the common manner to designate donor and acceptor type impurities which promote electron and hole type carriers respectively as the majority carriers. The "++" symbol, when used as a suffix with an impurity type should be interpreted to mean that the doping concentration of that impurity is heavier than the doping associated with just the letter identifying the impurity type without the "+" suffix. Conversely, the "−" symbol, when used as a suffix with an impurity type should be interpreted that the doping concentration of that impurity is lighter than the doping associated with just the letter identifying the impurity type without the "−" suffix.

Figure 1A:
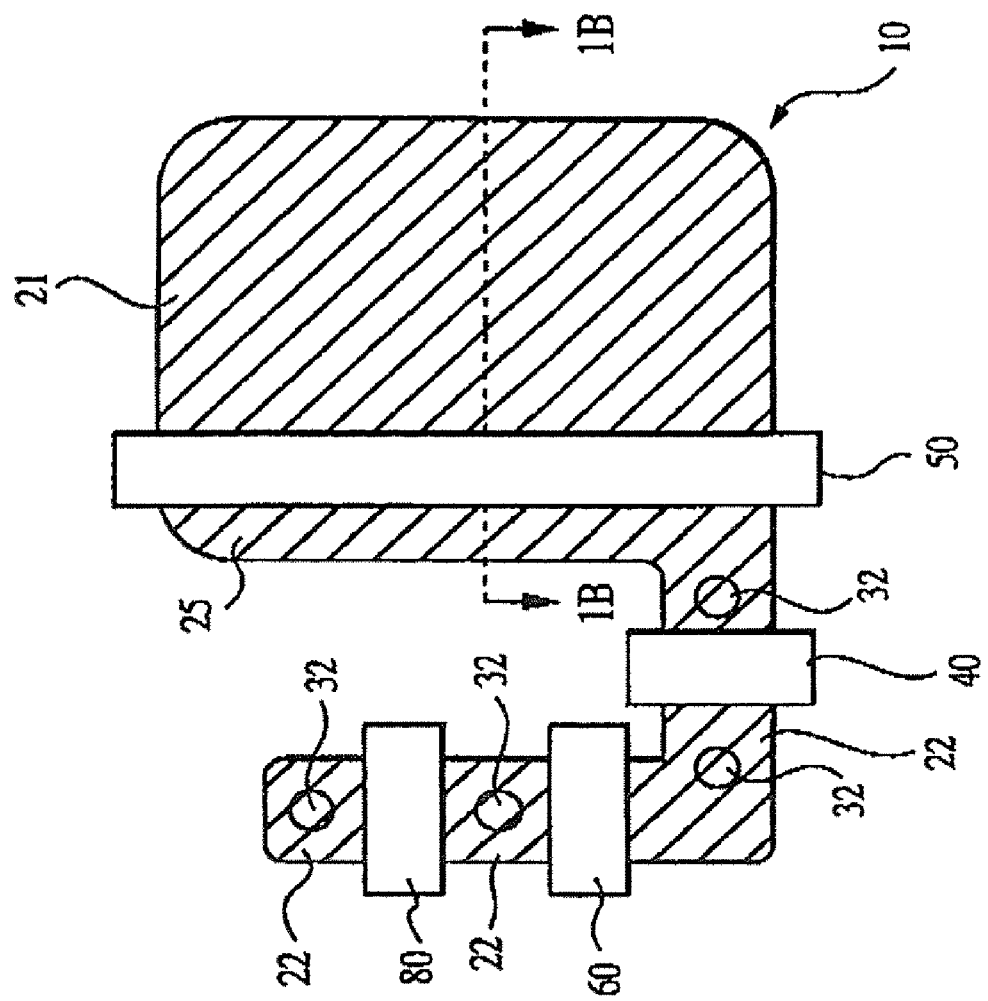
FIG. 1A is a top plan view of a conventional four transistor (4T) CMOS image sensor pixel fragment.
Figure 1B:
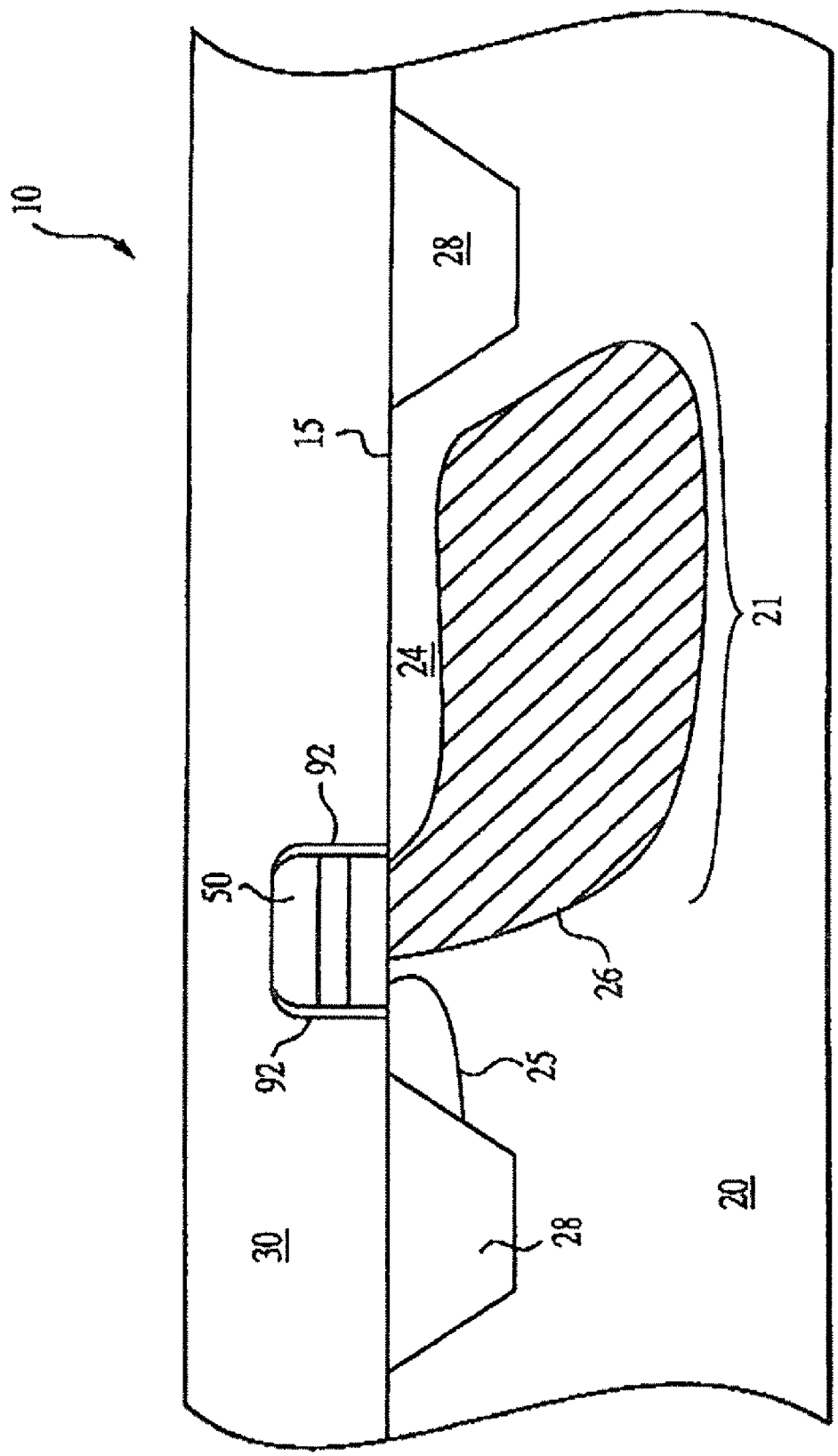
FIG. 1B is a side sectional view of the FIG. 1A image sensor pixel fragment taken along line 1B-1B.
Figure 2:
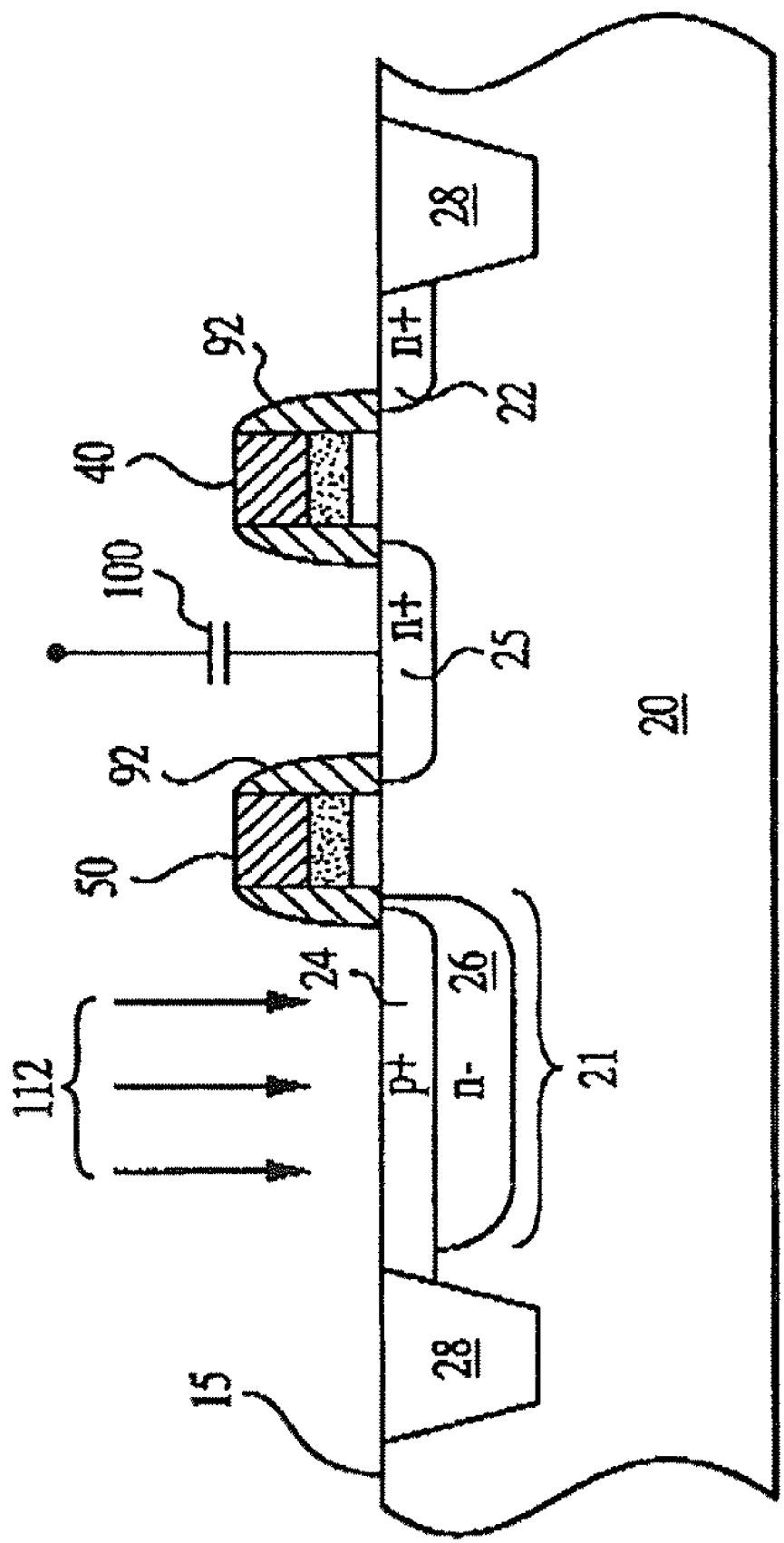
FIG. 2 depicts a conventional 4T CMOS image sensor.
Figure 3:
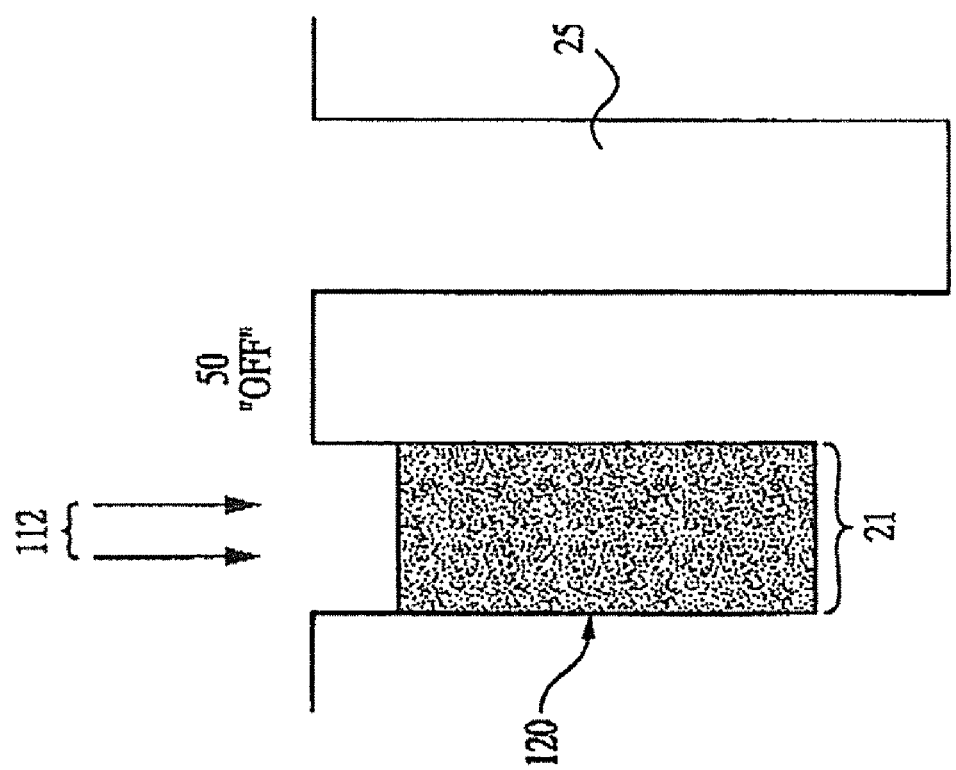
FIG. 3 is a potential diagram of a conventional 4T CMOS sensor during a light integration period.
Figure 4:
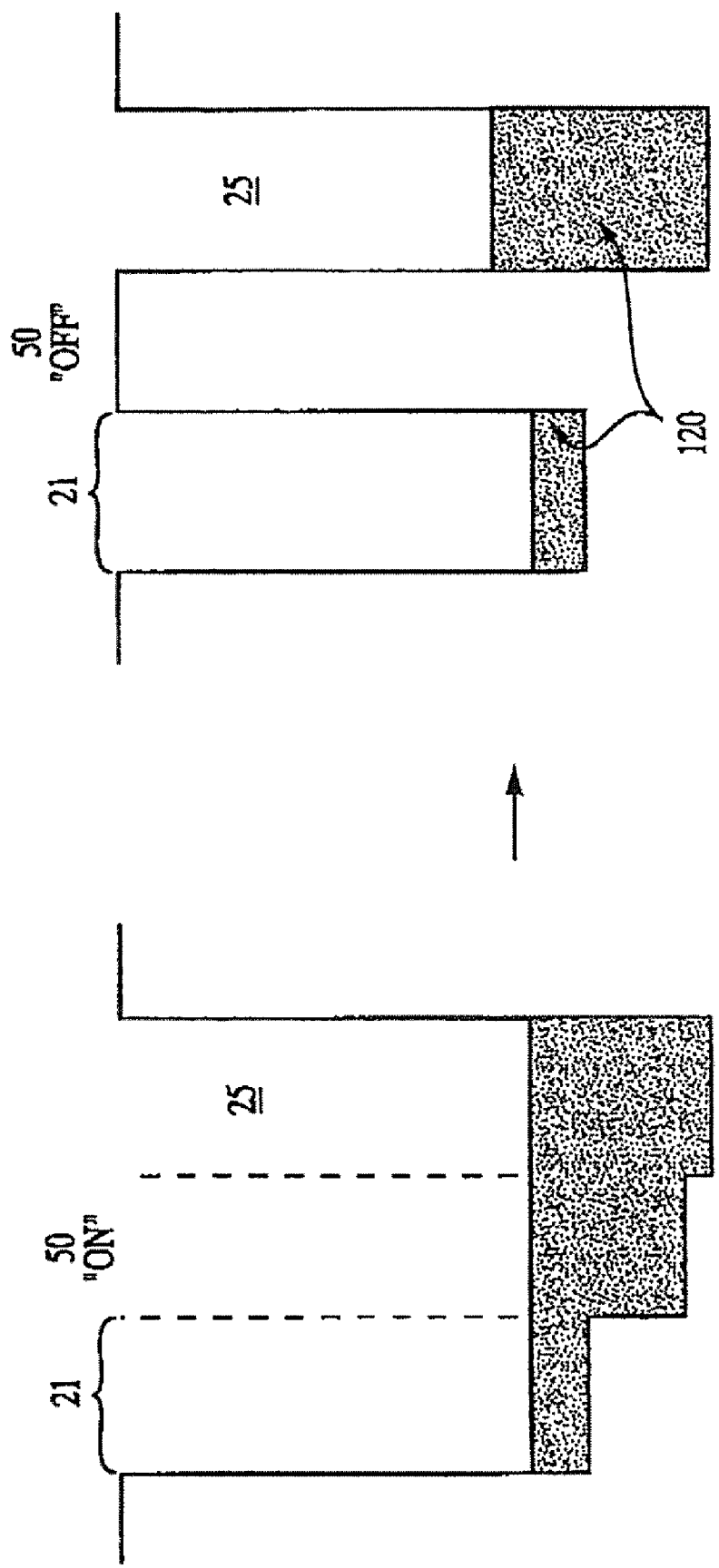
FIG. 4 is a diagram depicting an operation of charge transfer in a conventional 4T CMOS sensor.
Figure 5:
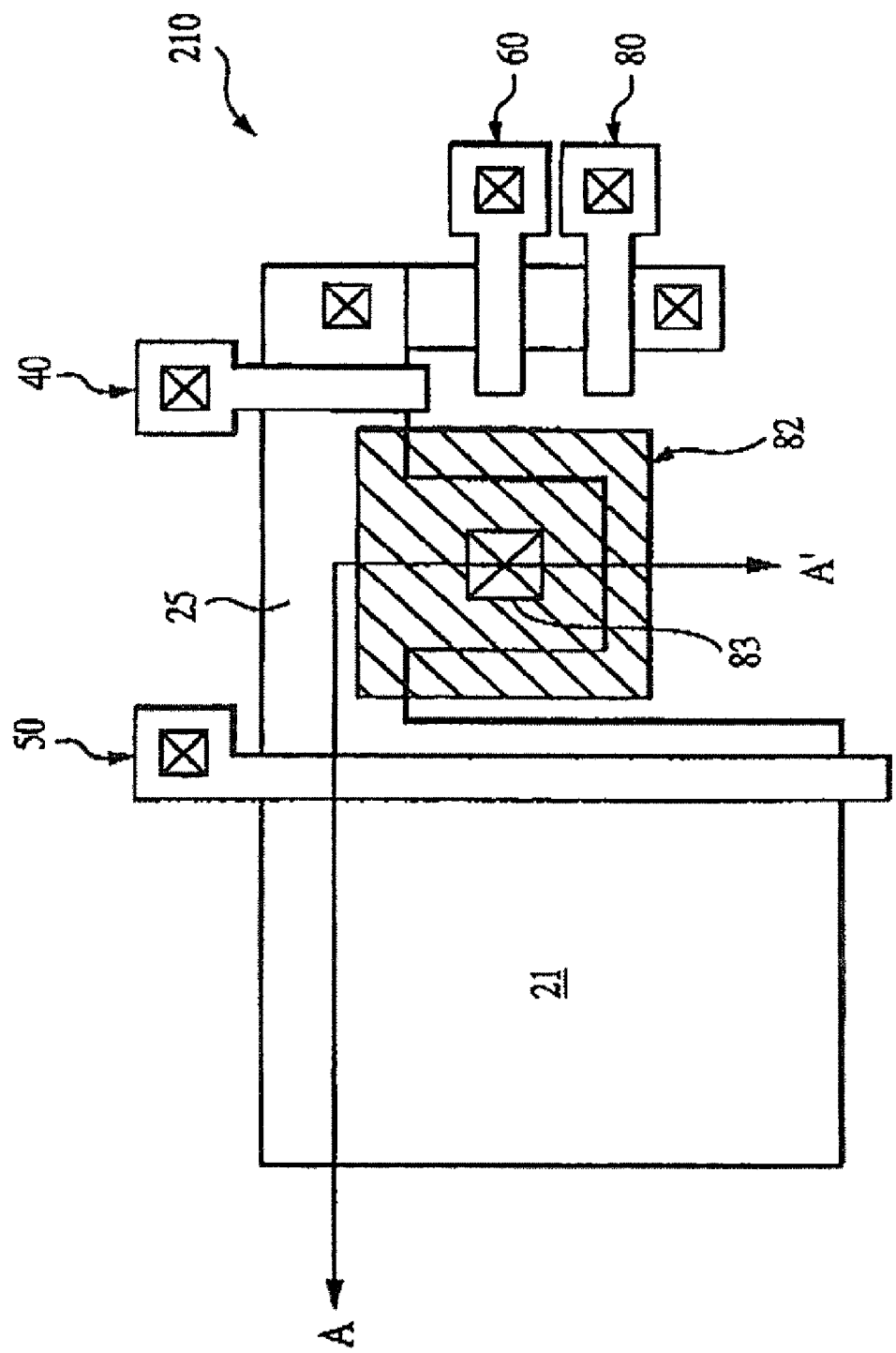
FIG. 5 is a top view of an example of a 4T CMOS pixel in accordance with one embodiment of the invention.

FIG. 5 shows a top plan view of a first embodiment of a pixel constructed in accordance with the invention. FIG. 5 depicts a four transistor pixel 210 which includes transistor gate 50, reset transistor gate 40, source follower transistor gate 60 and readout transistor gate 80. A photodiode 21 and floating diffusion node 25 are also depicted. The transistors, associated gates 50, 40, 60 and 80, photodiode 21 and floating diffusion node 25 have the same function as like numbered structures in FIG. 1A. In addition, the pixel depicted in FIG. 5 comprise a floating diffusion capacitor 82, which has one lower capacitor plate electrically coupled to the floating diffusion node 25 and an upper capacitor plate connected to a contact 83. The structure and operation of like-numbered elements as described and set forth above in relation to FIGS. 1A, 1B, and 2, also apply to like structures of FIG. 5.

As shown in FIG. 5, the floating diffusion capacitor 82 is formed over a portion of the floating diffusion node 25, and is located between the transfer gate 50 and reset gate 40. The capacitor 82 covers an active area that includes the floating diffusion node 25. The capacitor 82 can occupy a larger area compared to a transistor gate on a conventional pixel. The capacitor 82 needs only a source terminal as no drain terminal is necessary since the lower electrode of capacitor 82 is the floating diffusion node 25. Metal lines can be fabricated to connect with contact 83 which is electrically coupled to an upper electrode of capacitor 82. FIG. 5 also depicts a source follower gate 60 and row select gate 80 (described above with reference to FIG. 1).

The capacitor 82 can be formed in a manner similar to the polysilicon gates of the transistors of the pixel, including transfer gate 50, and at the same time as the process steps used to form the other gates of the pixel cell transistors. For example, an insulating layer may be blanket formed over the substrate as the gate oxide layer, then a polysilicon blanket layer is formed, followed by a blanket formation of an insulation layer. The layers are then photolithographically patterned, to form capacitor 82 and the other transistor gates. Thus, masking and etch steps for forming the gate capacitor 82, transfer gate 50, source follower gate 60, row select gate 80 and reset gate 40, and other transistor gate structures on a chip containing a pixel array can all be performed at the same time. The capacitor 82 is formed in an area where it does not block the photosensitive area, e.g., photodiode 21, of the imager.

Figure 6:
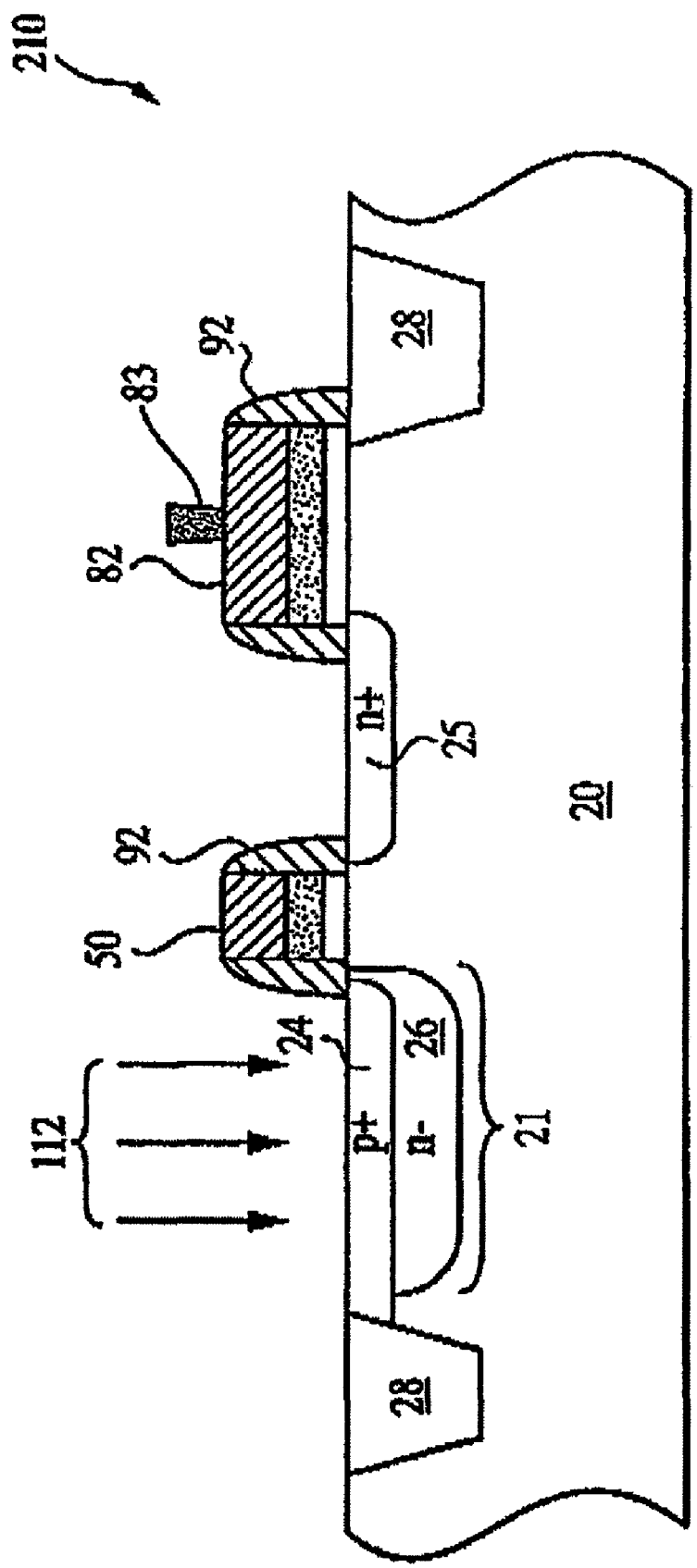
FIG. 6 is a cross-sectional view of the pixel illustrated in FIG. 5 taken along line A-A' of FIG. 5.

FIG. 6 depicts a cross-sectional view of the pixel depicted in FIG. 5 along line A-A' of FIG. 5. As shown in FIG. 6, capacitor 82 overlies at least a portion of trench isolation region 28; however, it should be understood that the capacitor 82 may be formed over any other portion of substrate 20 using the same process steps to form transfer gate 50, reset gate 40, source follower gate 60, row select gate 80 and other transistor gate structures on a chip containing a pixel array. There may optionally be a cap layer of TEOS (tetraethyl orthosilicate) or other coating compound formed over the gates, applied using chemical vapor deposition (CVD), for example, or another deposition technique.

As shown in FIG. 6, optional sidewall spacers 92 are shown formed along both sides of transfer gate 50 and capacitor 82. Like-numbered elements described above also refer to the same elements depicted in FIG. 6. Optional contact 83 is shown formed over the upper surface of capacitor 82. Trench isolation regions 28 may be formed by an STI process, a Local Oxidation of Silicon (LOCOS) process, or other suitable process.

A translucent or transparent insulating layer (not shown) may optionally be formed over the elements of the pixel. Such layers might include materials as $SiO_2$, BPSU, PSG, BSG, SOB, BPSG, or TEOS, any of which could be planarized as appropriate. Conventional processing methods may be carried out to form, for example, contacts (not shown) in the insulating layer to provide electrical connection to source/drain regions, floating diffusion region 25, and other wiring to connect gate lines and other connections in the pixel 210. The contact holes are then metallized to provide electrical contact to the photogate, reset gate, transfer gate, and diffusions.

In general, process steps may be varied as is required or convenient for a particular process flow. The above description of fabrication methods is only illustrative. The techniques described above may be implemented with a wide variety of fabrication technologies.

With reference to FIGS. 5-8, gate capacitor 82 associated with floating diffusion node 25 can selectively increase the storage capacity of the floating diffusion node 25. In some circumstances, for example under low light conditions, it may be desirable to only rely on the inherent capacity of the floating diffusion node 25. Under such low light conditions, the capacitor 82 remains in the "off" or inactive state; thus, the capacitor 82 is not activated and contract 83 floats or is grounded. In other circumstances, including conditions with greater light intensity, it may be desirable to rely on both the inherent capacity of the floating diffusion node 25 and the additional capacity provided by capacitor 82. Under such "thigh light" conditions, for example, gate capacitor 82 is selectively activated by application of a voltage to contact 83 to provide additional charge storage capacity. This selective gating of the capacitor 82 provides additional capacitance for storing charge transferred to node 25 from photodiode 21.

Figure 7:
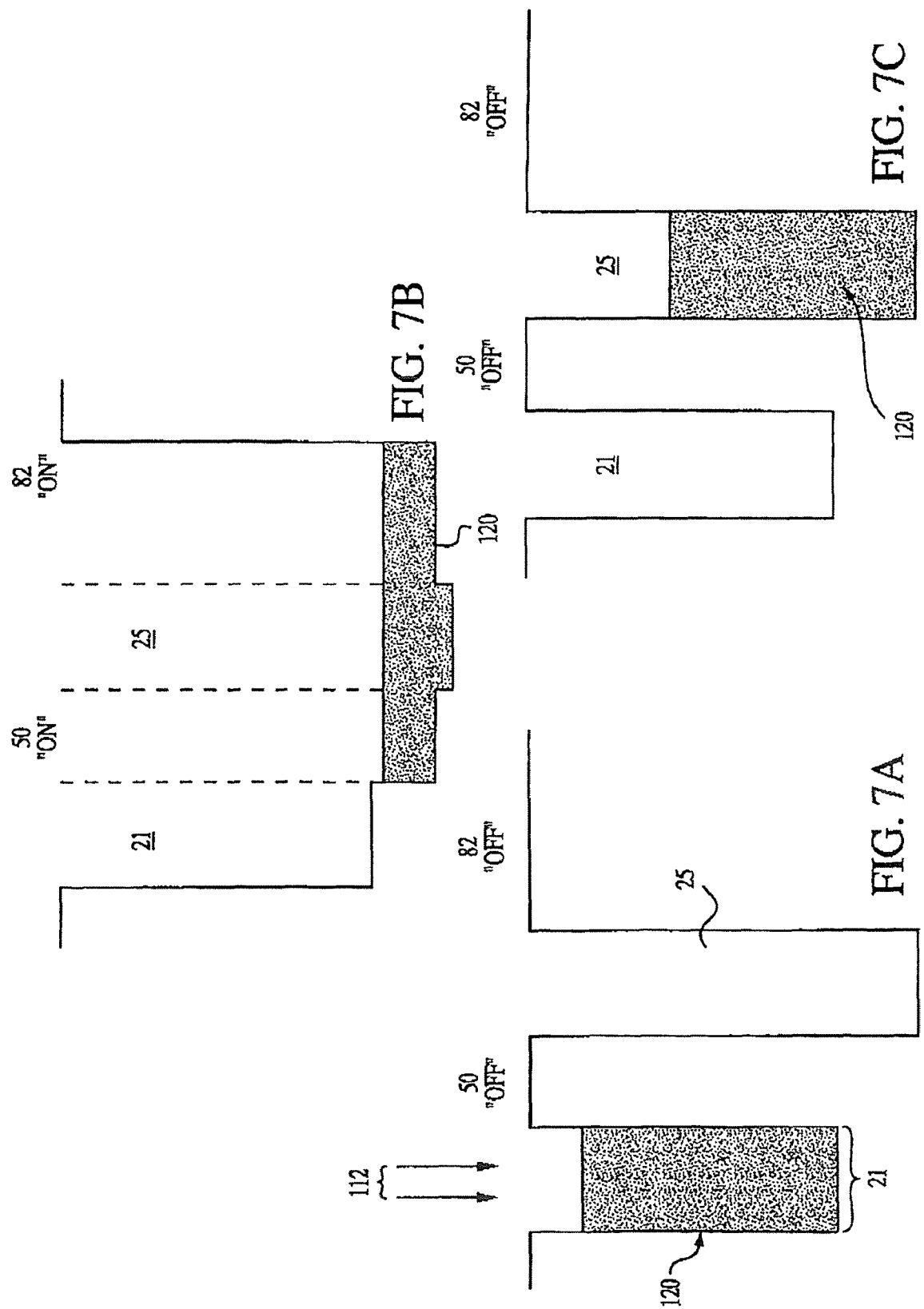
FIGS. 7A-7C are simple energy band diagrams for the operation of the pixel constructed in accordance with one embodiment of the invention.

An exemplary operation of the pixel 210 of the invention is now described with reference to FIGS. 7 and 8. When the capacitor 82 is in an "off" state, the floating diffusion capacitance comes from the floating diffusion node 25 p+/n junction only. If the capacitor 82 is in an "on" state, the capacitance of the capacitor 82 is added to that of the floating diffusion node 25. As a result, the total capacitance of the floating diffusion node 25 is increased.

As shown in FIG. 7a, the gate capacitor 82 and the transfer gate 50 are in the "off" state. At the end of the charge integration time, the floating diffusion node 25 previously reset by the reset transistor formed about reset gate 40 is ready to receive electron charges 120 from the photodiode 21. The capacitor 82 is turned "on" before turning "on" the transfer gate 50. As shown in FIG. 7b, once the capacitor 82 and the transfer gate 50 are turned "on," electron charges 120 are released to move from the photodiode 21 to the floating diffusion node 25. Since the total capacitance of the floating diffusion node 25 is now large enough due to the capacitor 82, there is no remaining charge in the photodiode 21. There is no charge sharing with the photodiode 21, and thus no lag signal.

As shown in FIG. 7c, the next pixel operation comprises turning "off" the transfer gate 50 and the capacitor 82 after complete charge transfer into the floating diffusion node 25. The electron charges 120 are in the floating diffusion node 25 and are read out by source follower transistor which has its gate connected to node 25. The source follower transistor converts the stored charges into an output voltage.

Figure 8:
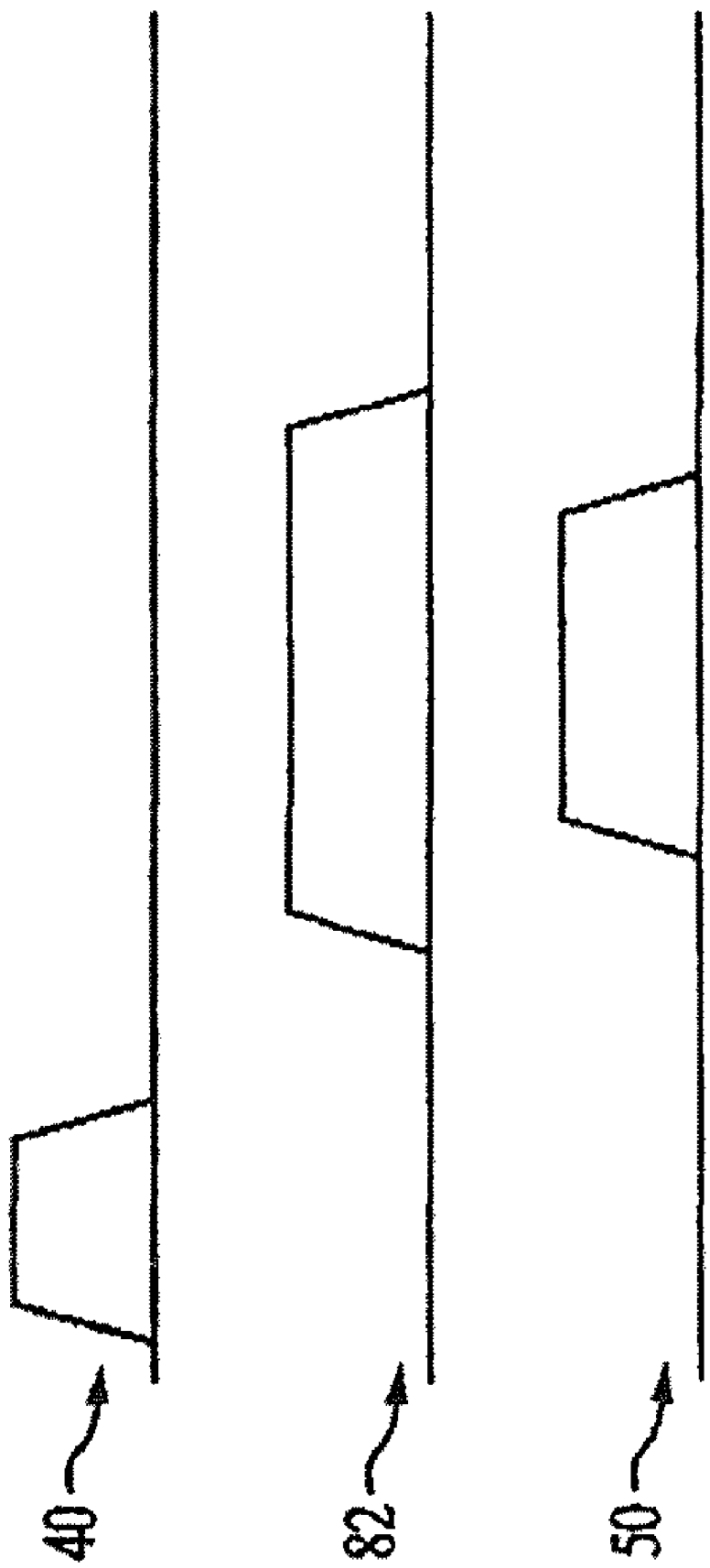
FIG. 8 illustrates a timing diagram of the operation of a pixel constructed in accordance with the invention.

With reference to the above description of FIGS. 7a-7c, FIG. 8 illustrates a sample timing diagram of operation of reset gate 40, gate capacitor 82, and transfer gate 50. As shown in FIG. 8, after activation of the reset transistor 40, the capacitor 82 is turned "on" before turning "on" the transfer gate 50 in order to transfer electron charges 120 from the photodiode 21 to the floating diffusion node 25.

Figure 9:
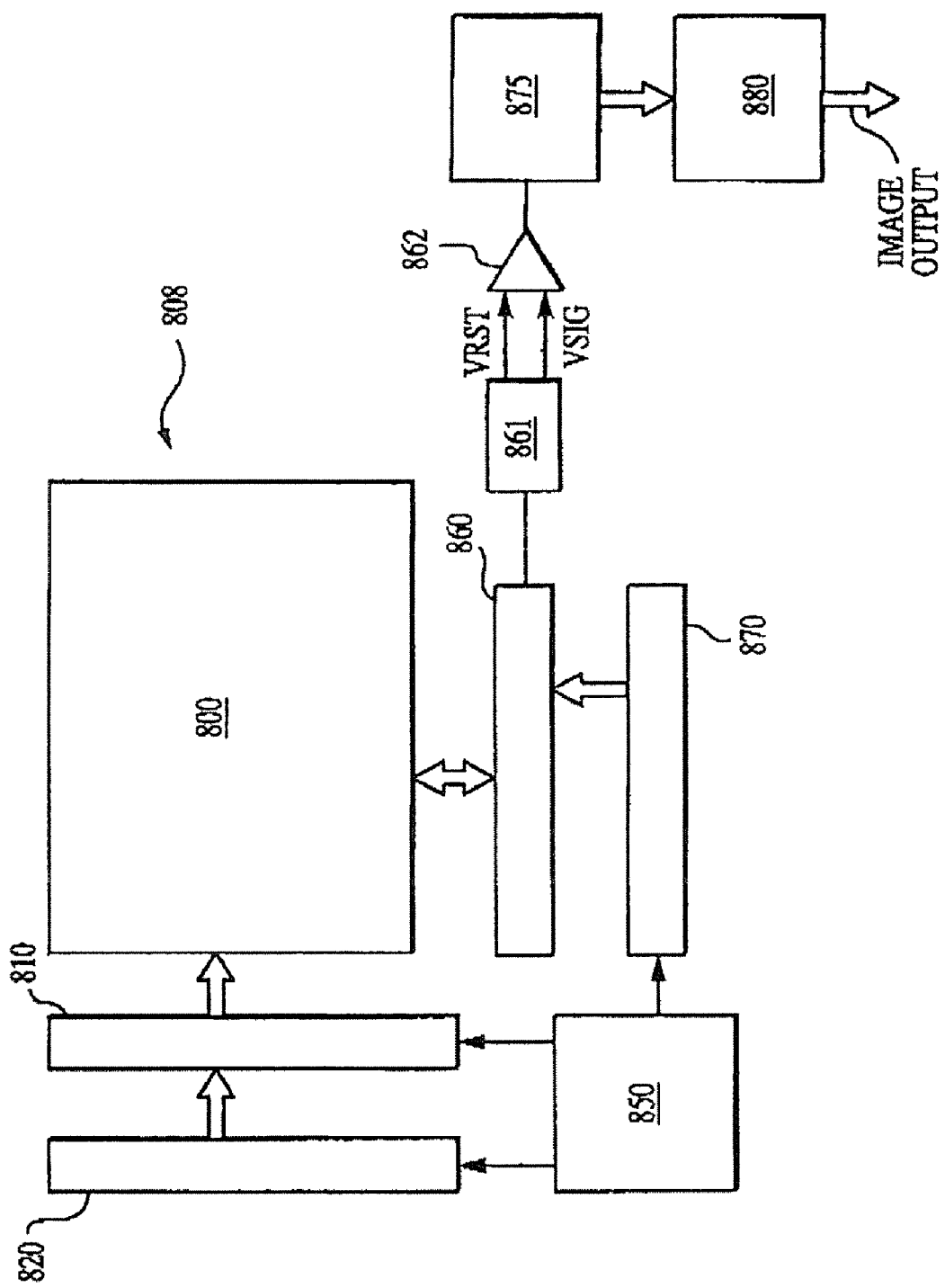
FIG. 9 illustrates a block diagram of a CMOS imager integrated circuit having a pixel array according to an exemplary embodiment of the invention.

FIG. 9 illustrates a block diagram of a CMOS imager integrated circuit (IC) 808 having a pixel array 800 containing a plurality of pixels arranged in rows and columns. The pixels of each row in array 800 are all turned on at the same time by a row select line, and the pixels of each column are selectively output by respective column select lines.

The row lines are selectively activated by a row driver 810 in response to row address decoder 820. The column select lines are selectively activated by a column selector 860 in response to column address decoder 870. The pixel array 800 is operated by the timing and control circuit 850, which controls address decoders 820, 870 for selecting the appropriate row and column lines for pixel signal readout. The timing and control circuit 850 may be used to generate timing signals to selectively operate a gate capacitor 82.

The pixel column signals, which typically include a pixel reset signal ($V_{rst}$) and a pixel image signal ($V_{sig}$), are read by a sample and hold circuit 861 associated with the column selector 860. A differential signal ($V_{rst}$-$V_{sig}$) is produced by differential amplifier 862 for each pixel which is amplified and digitized by analog-to-digital converter 875 (ADC). The analog-to-digital converter 875 supplies the digitized pixel signals to an image processor 880 which can perform image processing in which signals read out from blue pixels are treated as levels of blue light intensity, signals read out from green pixels are treated as levels of green light intensity, and signals from red pixels are treated as levels of red light intensity, for example. The resulting red, green and blue pixel values can be provided to other components to define an RGB output image.

Figure 10:
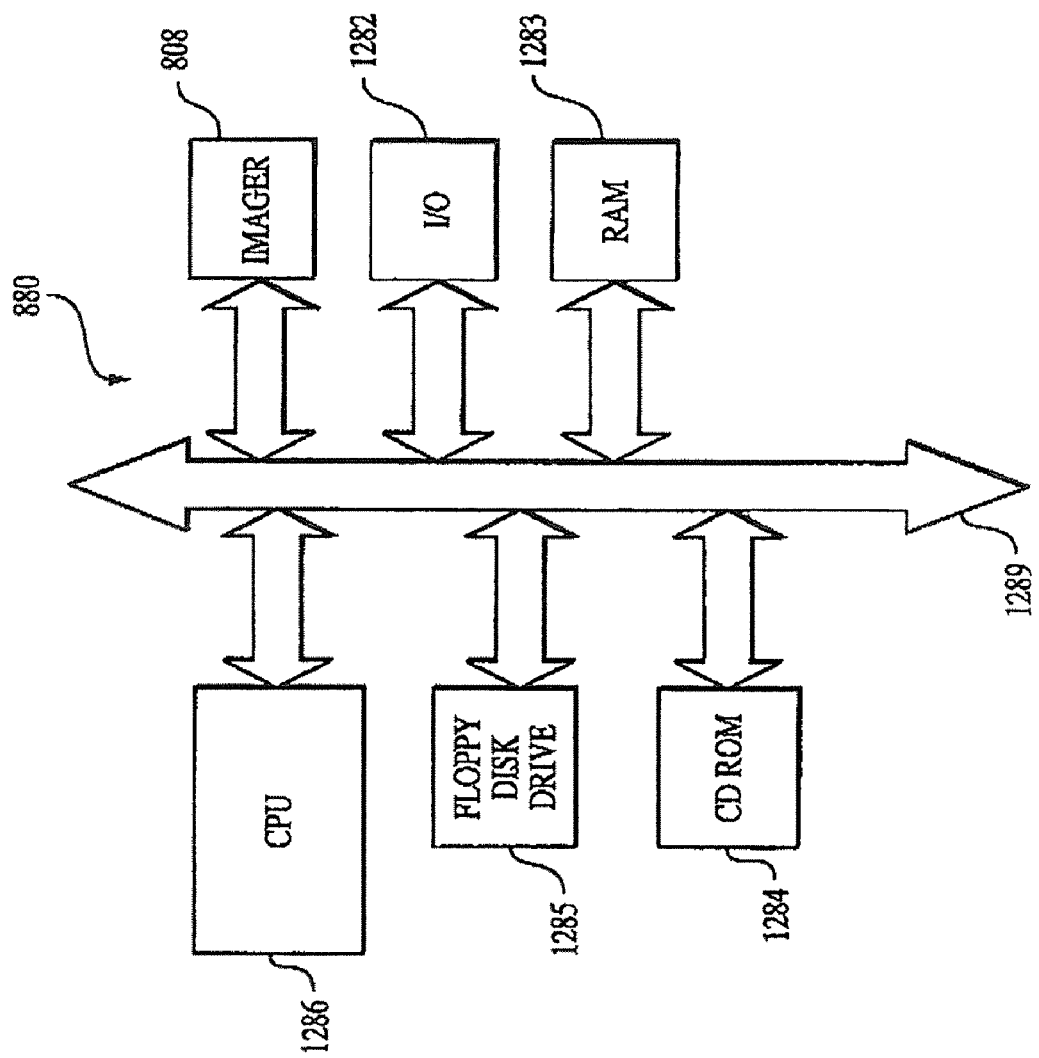
FIG. 10 illustrates a diagram of an image processor system utilizing the CMOS imager illustrated in FIG. 9.

Turning to FIG. 10, a typical processor-based system 880 is described as including an imager device 808 with pixel cells configured as described above in FIGS. 5-8. Processor-based system 880 is exemplary of a system having digital circuits that could include CMOS imager devices.

Processor-based system 880 contains a central processing unit (CPU) 1286, such as a microprocessor, that communicates with an input/output (I/O) device 1282 over a bus 1289. Imager 808, which produces an image output from a pixel array, also communicates with the CPU 1286 over bus 1289. The processor-based system 880 also includes random access memory (RAM) 1283, and may include peripheral devices, such as a floppy disk drive 1285 and a compact disk (CD) ROM drive 1284, which also communicate with CPU 1286 over the bus 1289. Imager 808 may be combined with a processor, such as a CPU, digital signal processor, or microprocessor, with or without memory storage on a single integrated circuit or on a different chip than the processor.

While the above-described embodiments of the invention relate to pixel cells comprising a floating diffusion gate capacitor, in which capacitance can be controlled by selective activation of the capacitor under certain circumstances, for example under high light conditions, or alternatively by maintaining an "inactive" capacitor (turned "off") under low light conditions, one skilled in the art will recognize that the broad scope of the invention includes various other types of pixel cells and imager devices separately or integrated with one or more processing components in a semiconductor device. Selective activation of the capacitor of the invention enables an image device, for example, to achieve a high dynamic range, high output signal, high signal-to-noise ratio, and optimized charge storage capacity under any type of light conditions, as well as high conversion gain without charge sharing or a lag output signal.

Although the invention is described above for use in a four transistor pixel cell for a CMOS image sensor, the broad scope of the invention is not limited to such and may be applicable to three transistor pixel cells as well as pixel cells having more than four transistors. The gate capacitor may also be used with any suitable image sensor, and may be used for example with CCD image sensors. Further, although one gate capacitor is illustrated and described with reference to FIGS. 5-8, it should be understood that more than one gate capacitor may also be coupled to a floating diffusion node.

Figure 11:
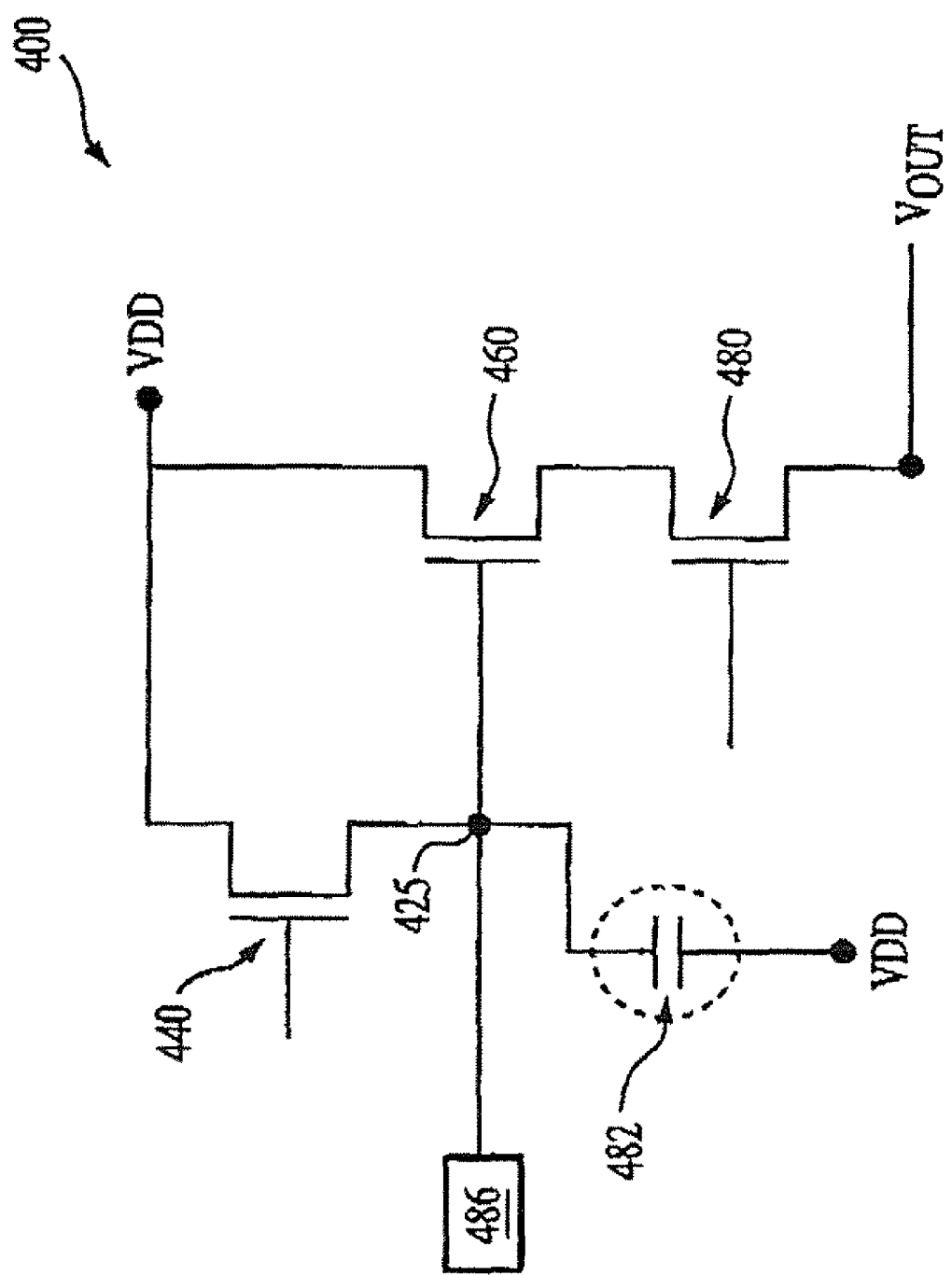
FIG. 11 illustrates a simplified circuit for a CCD imager according to an exemplary embodiment of the invention.

FIG. 11 shows a simplified circuit 400 for an exemplary CCD imager having a gate capacitor 482. Gate capacitor 482 is electrically connected to a floating diffusion node 425 and voltage source VDD. The output stage of a CCD image sensor provides sequential pixel signals as output signals, and uses floating diffusion node 425, source follower transistor having gate 460, and reset gate 440 in a similar manner to the way these elements are used in the pixel of a CMOS imager. Source follower 460 converts stored charges into a voltage and is connected to row select transistor having gate 480. Unlike a CMOS imager, register 486 operates for input and output of photo-generated charge.

The imager devices described above may be formed at different sizes, for example, as imagers having arrays of about 1.3 megapixels to about 4 megapixels. Further, the above-described embodiments of the invention include CMOS pixels with shallow buried photodiodes. The broad scope of the invention includes other types of photosensitive elements in other configurations.

The above description and drawings illustrate embodiments which achieve the objects of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A pixel of an imager, the pixel comprising:
    a photosensing region for generating charge in response to incident light;
    a first transistor having a gate and adjacent the photosensing region, the first transistor for transferring the generated charge to a floating diffusion region;
    a second transistor having a gate on a side of the first transistor gate opposite the photosensing region for resetting the floating diffusion region to a predetermined voltage level, the floating diffusion region being between the first and second transistor gates; and
    at least one gate capacitor switchably operable to increase a capacitance of the floating diffusion region, the gate capacitor being located at least partially over the floating diffusion region.

2. The pixel of claim 1, wherein the gate capacitor is over a portion of an isolation region.

3. The pixel of claim 1, further including a third transistor having a gate coupled to the floating diffusion region for converting stored charge into a voltage.

4. A pixel of an imager, the pixel comprising:
    a photosensing region for generating charge in response to incident light;
    a floating diffusion region for receiving charge from the photosensing region;
    a floating diffusion capacitor coupled to the floating diffusion region, wherein an electrode of the floating diffusion capacitor is the floating diffusion region, wherein the floating diffusion capacitor comprises a gate connected between the floating diffusion region and a voltage source line, and wherein the gate is at least partially over the floating diffusion region.

5. The pixel of claim 4, further comprising a first transistor coupled between the photosensing region and the floating diffusion region for transferring charge from the photosensing region to the floating diffusion region.

6. The pixel of claim 5, further comprising a second transistor having a gate electrically connected to the floating diffusion region.

7. The pixel of claim 5, further comprising a second transistor coupled to the floating diffusion region for resetting the floating diffusion region to a predetermined voltage level.

8. The pixel of claim 4, wherein the gate is over a portion of an isolation region.

9. An imager comprising:
    at least one photosensing region for generating charge in response to incident light;
    at least one floating diffusion region coupled to the at least one photosensing region for receiving charge from the one of the at least one photosensing region;
    at least one floating diffusion capacitor coupled to the at least one floating diffusion region, wherein a first electrode of the at least one floating diffusion capacitor is the at least one floating diffusion region, wherein the at least one floating diffusion capacitor comprises a gate connected between the at least one floating diffusion region and a voltage source line, and wherein the gate is at least partially over the at least one floating diffusion region.

10. The imager of claim 9, further comprising an array of pixels, a plurality of photosensing regions, a plurality of floating diffusion regions, and a plurality of floating diffusion capacitors, wherein each pixel comprises one of the plurality of photosensing regions, one of the plurality of floating diffusion regions and one of the plurality of floating diffusion capacitors.

11. The imager of claim 10, wherein each pixel further comprises at least one transistor coupled between a respective photosensing region and a respective floating diffusion region.

12. The imager of claim 9, wherein a second electrode of the at least one floating diffusion capacitor is connected to a contact, and wherein the contact is connected to timing and control circuitry for generating a timing signal to selectively operate the at least one floating diffusion capacitor.

13. The imager of claim 12, wherein the at least one floating diffusion capacitor is selectively operable to increase the capacitance of the at least one floating diffusion region.

* * * * *